US009935216B2

(12) United States Patent
Okuuchi

(10) Patent No.: US 9,935,216 B2
(45) Date of Patent: Apr. 3, 2018

(54) WAFER FOR SOLAR CELL, METHOD OF PRODUCING WAFER FOR SOLAR CELL, METHOD OF PRODUCING SOLAR CELL, AND METHOD OF PRODUCING SOLAR CELL MODULE

(71) Applicant: SUMCO Corporation, Minato-ku, Tokyo (JP)

(72) Inventor: Shigeru Okuuchi, Minato-ku (JP)

(73) Assignee: SUMCO Corporation, Minato-ku (JP)

( * ) Notice: Subject to any disclaimer, the term of this patent is extended or adjusted under 35 U.S.C. 154(b) by 0 days.

(21) Appl. No.: 14/878,925

(22) Filed: Oct. 8, 2015

(65) Prior Publication Data

US 2016/0099360 A1 Apr. 7, 2016

Related U.S. Application Data

(62) Division of application No. 14/347,605, filed as application No. PCT/JP2012/075273 on Sep. 24, 2012, now abandoned.

(30) Foreign Application Priority Data

Sep. 28, 2011 (JP) .................... 2011-212335

(51) Int. Cl.
  *H01L 31/0236* (2006.01)
  *H01L 31/18* (2006.01)
  *H01L 31/0368* (2006.01)
(52) U.S. Cl.
  CPC .. *H01L 31/02363* (2013.01); *H01L 31/03682* (2013.01); *H01L 31/182* (2013.01);
  (Continued)

(58) Field of Classification Search
  CPC ................................. H01L 31/02363
  See application file for complete search history.

(56) References Cited

U.S. PATENT DOCUMENTS 6,156,968 A  12/2000 Nishimoto
6,568,384 B1 *  5/2003 Onizaki ............... B28D 5/007
125/16.02

(Continued)

FOREIGN PATENT DOCUMENTS

CN  101548367 A  9/2009
CN  102113132 A  6/2011

(Continued)

OTHER PUBLICATIONS

Second Office Action dated May 10, 2016, issued in corresponding Chinese Patent Application No. 201280074220.9, filed Sep. 24, 2012, 8 pages.

(Continued)

*Primary Examiner* — Seahvosh Nikmanesh
(74) *Attorney, Agent, or Firm* — Christensen O'Connor Johnson Kindness PLLC

(57) ABSTRACT

Provided is a wafer for solar cell which can be produced using a polycrystalline semiconductor wafer cut out using a bonded abrasive wire, which wafer can be used for manufacturing a solar cell with high conversion efficiency.
In a wafer for solar cell before acid texturing of the present invention, produced from a polycrystalline semiconductor wafer cut out using a bonded abrasive wire, an amorphous layer does not exist, and irregularities caused due to the cutting using the bonded abrasive wire are left in at least one surface of the wafer for solar cell.

6 Claims, 5 Drawing Sheets

(52) U.S. Cl.
CPC ........ *H01L 31/1804* (2013.01); *Y02E 10/546* (2013.01); *Y02E 10/547* (2013.01); *Y02P 70/521* (2015.11)

(56) References Cited

U.S. PATENT DOCUMENTS

| | | | |
|---|---|---|---|
| 7,089,925 B1* | 8/2006 | Lin | B23D 61/185 125/12 |
| 2006/0185716 A1* | 8/2006 | Murozono | H01L 31/035281 136/250 |
| 2008/0001243 A1 | 1/2008 | Otake | |
| 2009/0280597 A1* | 11/2009 | Wijekoon | H01L 21/30608 438/71 |
| 2010/0029034 A1* | 2/2010 | Nishimoto | H01L 31/02363 438/71 |

FOREIGN PATENT DOCUMENTS

| | | |
|---|---|---|
| EP | 2 182 556 A1 | 5/2010 |
| JP | 2005-136081 A | 5/2005 |
| JP | 2010-80829 A | 4/2010 |
| JP | 2011-146432 A | 7/2011 |
| KR | 10-2008-0046439 A | 5/2008 |
| TW | 201115592 A1 | 5/2011 |
| TW | 201117404 A1 | 5/2011 |
| WO | 2011/024910 A1 | 3/2011 |

OTHER PUBLICATIONS

Notification of Reasons for Refusal dated Feb. 29, 2016, issued in corresponding Korean Patent Application No. 10-2014-7010802, filed Sep. 24, 2012, 7 pages.

International Search Report dated Oct. 23, 2012, issued in corresponding International Application No. PCT/JP2012/075273, filed Sep. 24, 2012, 3 pages.

Notification of Reasons for Refusal dated May 19, 2015, in corresponding Japanese Application No. 2011-212335, filed Sep. 28, 2011, 4 pages.

Office Action dated Nov. 21, 2014, issued in corresponding Taiwanese Patent Application No. 101134917, filed Sep. 24, 2012, 8 pages.

First Office Action dated Aug. 31, 2015, issued in corresponding Chinese Patent Application No. 201280074220.9, filed Sep. 24, 2012, 13 pages.

Office Action dated Sep. 23, 2015, issued in corresponding German Patent Application No. 11 2012 004 047.3, filed Sep. 24, 2012, 17 pages.

Notification of Reasons for Refusal dated Jul. 25, 2015, issued in corresponding Korean Patent Application No. 10-2014-7010802, filed Sep. 24, 2012, 7 pages.

\* cited by examiner

WAFER FOR SOLAR CELL, METHOD OF PRODUCING WAFER FOR SOLAR CELL, METHOD OF PRODUCING SOLAR CELL, AND METHOD OF PRODUCING SOLAR CELL MODULE

CROSS-REFERENCES TO RELATED APPLICATIONS

This application is a division of U.S. patent application Ser. No. 14/347,605, filed Mar. 26, 2014, which is the national stage of International Patent Application No. PCT/JP2012/075273, filed Sep. 24, 2012, which claims priority to Japanese Patent Application No. 2011-212335, filed Sep. 28, 2011.

TECHNICAL FIELD

The present invention relates to a wafer for solar cell, a method of producing a wafer for solar cell, a method of producing a solar cell, and a method of producing a solar cell module. The present invention relates, in particular, to a wafer for solar cell produced using a polycrystalline semiconductor wafer cut out using a bonded abrasive wire, which wafer can be used for manufacturing a solar cell with high conversion efficiency.

BACKGROUND ART

In general, a solar cell is manufactured using a silicon wafer or other semiconductor wafer. In order to improve conversion efficiency of the solar cell, it is necessary to reduce the light that reflects on a light receiving surface of the solar cell and the light that passes through the solar cell. For example, in preparing a crystalline solar cell using the silicon wafer, since the silicon wafer has a low transmittance of visible light contributing to photoelectric conversion, in order to improve the conversion efficiency, it is important to reduce reflection loss of the visible light on the silicon wafer surface acting as the light receiving surface, thereby effectively capturing incident light within the solar cell.

Techniques for reducing the reflection loss of the incident light on the silicon wafer surface include a technique of forming an antireflection film on the surface and a technique of forming, in the surface, an uneven structure such as micro-sized pyramidal irregularities called a textured structure. As for the latter technique, the method of forming the textured structure in the surface is suitable for single crystal silicon and represented by a method of etching the single crystal silicon (100) surface with alkaline solution. This method leverages an etching rate of the (111) surface that is lower than that of the (100) surface and the (110) surface. As the latter technique, isotropic etching with acid solution is also known. The etching with an acid solution uses acid containing nitric acid and hydrofluoric acid, thereby making a reaction in which the surface of silicon is oxidized to form $SiO_2$, and then the $SiO_2$ is dissolved with hydrofluoric acid. When a polycrystalline silicon wafer having a surface with non-uniform crystal orientation is etched with an alkaline solution, the textured structure can be formed only on crystal grains having a (100) surface exposed in the wafer surface, and the textured structure cannot be sufficiently formed on the other crystal grains. Accordingly, the uneven structure is formed in the polycrystalline silicon wafer mainly by etching with an acid solution. In this specification, the treatment of etching a surface of a polycrystalline wafer with acid solution in order to reduce the reflection loss is hereinafter referred to as "acid texturing".

Here, focusing on that a sufficient fill factor cannot be obtained by only etching a surface of a polycrystalline silicon substrate with an acid solution, JP 2005-136081 A (PTL 1) discloses a method of producing a solar cell wafer, including a step of etching the surface of the polycrystalline silicon substrate with an alkaline solution such as NaOH to 7 µm or more before acid texturing. A silicon wafer has cutting damage on its surface immediately after being cut from an ingot. The etching with an alkaline solution in PTL 1 is performed to an extent such that the damage due to the slicing process can be removed. Specifically, after removing the damage due to slicing by alkali treatment, an uneven structure is formed by etching with an acid solution, thereby manufacturing solar cells using this wafer as their substrate.

Here, the methods of cutting a polycrystalline semiconductor block for obtaining a polycrystalline semiconductor wafer can be broadly classified into two types: methods using free abrasive grains (free abrasive cutting) and methods using bonded abrasive grains (bonded abrasive cutting). In the free abrasive cutting, a slurry containing abrasive grains is used as a working fluid, and a wire runs while continuously supplying the slurry to the wire. The polycrystalline semiconductor block is cut by the grinding action of the slurry fed by the running wire to the portion to be cut. However, the free abrasive cutting has some problems such as low slicing speed, since slurry is used as a working fluid. Hence, in recent years, the bonded abrasive cutting for cutting a polycrystalline semiconductor block using a bonded abrasive wire has been attracting attention. In the bonded abrasive cutting, slicing is performed using a wire to which abrasive grains are fixed with a resin or by electroplating (which is called "bonded abrasive wire"). Specifically, using the bonded abrasive wire, the polycrystalline semiconductor block is sliced by the grinding action of the abrasive grains fixed to the surface of the wire. Accordingly, a working fluid (coolant) free of abrasive grains can be used, which can solve the problem of the free abrasive wire, caused by slurry.

CITATION LIST

Patent Literature

PTL 1: JP 2005-136081 A

SUMMARY OF INVENTION

Technical Problem

However, it has been evident that solar cells produced from a polycrystalline semiconductor wafer cut using a bonded abrasive wire have a lower conversion efficiency than solar cells produced from a polycrystalline semiconductor wafer cut by free abrasive cutting. Consequently, polycrystalline semiconductor wafers cut using the bonded abrasive wire are not currently used as wafers for solar cell. Accordingly, a method of producing solar cells with high conversion efficiency from a polycrystalline semiconductor wafer cut using a bonded abrasive wire has been demanded.

In view of the above problems, an object of the present invention is to provide a wafer for solar cell produced using a polycrystalline semiconductor wafer cut out using a bonded abrasive wire, which wafer can be used for manufacturing a solar cell with high conversion efficiency and a method of producing the same, and a method of producing a solar cell and producing a solar cell module that includes the method of producing the wafer.

Solution to Problem

In order to achieve the above objects, the inventor of the present invention made various studies to find that when the surface of a polycrystalline semiconductor wafer cut using a bonded abrasive wire is in a certain condition before being subjected to acid texturing, a favorable uneven structure can be formed by subsequently performing acid texturing. Consequently, the inventor found that the reflection loss of light on the wafer surface can be effectively reduced, and the conversion efficiency of solar cells produced using this wafer can be improved, thus completing the present invention. The present invention has been made based on the above findings.

In order to achieve the above object, the present invention primarily includes the following components.
(1) A wafer for solar cell before acid texturing (before being acid textured), produced from a polycrystalline semiconductor wafer cut out using a bonded abrasive wire,
wherein an amorphous layer does not exist, and irregularities caused due to the cutting using the bonded abrasive wire are left in at least one surface of the wafer for solar cell.
(2) A method of producing a wafer for solar cell before acid texturing, from a polycrystalline semiconductor wafer cut out using a bonded abrasive wire,
wherein at least one surface of the polycrystalline semiconductor wafer is etched by bringing an alkaline solution containing alkali containing N as a constituent element into contact with the surface, such that an amorphous layer does not exist, and irregularities caused due to the cutting using the bonded abrasive wire are left in the at least one surface.
(3) The method of producing a wafer for solar cell, according to (2) above, wherein the alkaline solution contains hydrogen peroxide.
(4) The method of producing a wafer for solar cell, according to (2) or (3) above, wherein the alkaline solution contains a surfactant.
(5) The method of producing a wafer for solar cell comprising a step of acid texturing the at least one surface of the wafer for solar cell produced according to any one of (2) to (4) above.
(6) A method of producing a solar cell further comprising, in addition to the steps of the method of producing a wafer for solar cell according to (5) above, a step of producing a solar cell from the wafer for solar cell.
(7) A method of producing a solar cell module further comprising, in addition to the steps of the method of producing the solar cell according to (6) above, a step of producing a solar cell module from the solar cell.

Advantageous Effect of Invention

According to the present invention, a wafer for solar cell, having a surface free of an amorphous layer, is produced from a polycrystalline semiconductor wafer cut out using a bonded abrasive wire, in which the wafer for solar cell, irregularities caused by the cutting using the bonded abrasive wire are left; an uneven structure uniform in size and distribution can be formed on the wafer surface by subsequent acid texturing; and solar cells with high conversion efficiency can be manufactured using this wafer for solar cell.

DESCRIPTION OF EMBODIMENTS

The present invention will now be described in further detail. First, the polycrystalline semiconductor wafer used in the present invention is not limited in particular, and one commonly used in solar cell production can be used. For example, a polycrystalline silicon wafer obtained by slicing a polycrystalline silicon ingot can be used. The present invention will now be described taking as an example, a method of producing a wafer for polycrystalline silicon solar cell by etching a polycrystalline silicon wafer.
(Wafer for Solar Cell)

One embodiment of the present invention is a wafer for solar cell which is produced from a polycrystalline semiconductor wafer cut using a bonded abrasive wire, which wafer has not been subjected to acid texturing. The "wafer for solar cell" herein means a polycrystalline semiconductor wafer at least one surface of which is subjected to etching for producing a solar cell. The one surface acts as a light receiving surface of the solar cell. The wafer for solar cell according to the present invention is characterized in that an amorphous layer does not exist, and irregularities caused by cutting with the bonded abrasive wire are left in the one surface.

The technical significance of employing the characteristic structure of the present invention as set forth above will be described below with the operation and effects using specific examples.

Figure 4:
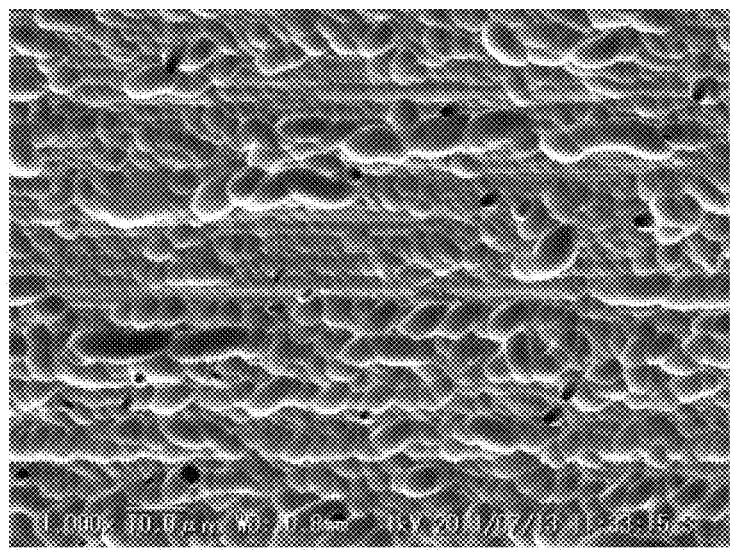
FIG. 4 is a SEM image illustrating a surface of a polycrystalline silicon wafer according to Comparative Example 1. The wafer is obtained by cutting polycrystalline silicon using a bonded abrasive wire and is subjected to acid texturing without having been etched with an alkaline solution.

According to the studies of the inventor, the conversion efficiency of a solar cell produced from a wafer for solar cell obtained by performing known acid texturing on a polycrystalline silicon wafer prepared by cutting with a bonded abrasive wire was lower than that of a solar cell produced from a wafer for solar cell obtained by performing the same acid texturing on a polycrystalline silicon wafer obtained by slicing by free abrasive cutting, as expected. The surface of the former wafer having been subjected to the acid texturing was observed, and it was found that the irregularities formed in the wafer surfaces were not uniform in size and distribution as shown in FIG. 4.

Figure 1A:
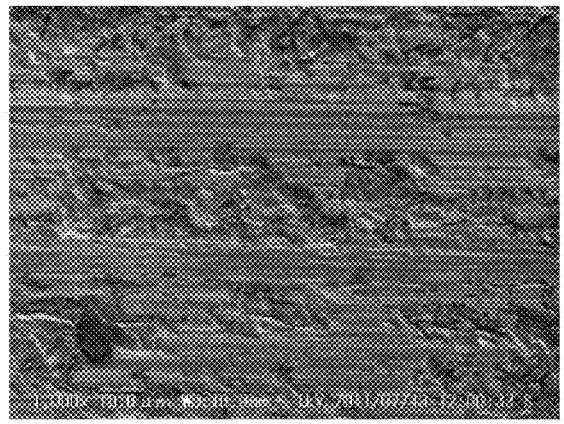
FIGS. 1(a), 1(b), and 1(c) are SEM images illustrating a surface of a polycrystalline silicon wafer according to Example 8, in which 1(a) shows the surface of the wafer after being cut out from polycrystalline silicon using a bonded abrasive wire, 1(b) shows the wafer surface subjected to subsequent etching with an alkaline solution containing 1.5% $NH_4OH$ and 1.5% $H_2O_2$, and 1(c) shows the wafer surface further subjected to later acid texturing.

Here, FIG. 1(a) shows a surface of a polycrystalline silicon wafer immediately after being cut with a bonded abrasive wire. As shown in FIG. 1(a), the irregularities caused by the cutting with the bonded abrasive wire are non-uniformly formed in the wafer surface, and the irregularities caused by the slicing are formed to have an orientation like a striped pattern along the moving direction of the wire (the transverse direction in the drawing). According to the studies made by the inventor, it was found that an amorphous layer was formed in a region (smooth area) having relatively fewer and smaller irregularities caused by the slicing. The amorphous layer inhibits the etching reaction of the acid texturing from proceeding. Accordingly, when the surface is acid textured, as in FIG. 4 described above, irregularities are hardly formed in the smooth area because etching is unlikely to proceed, whereas irregularities are easily formed in an area without an amorphous layer (a region where relatively large irregularities are apparently formed) because etching is likely to proceed. This was attributed to the non-uniformity of the irregularities in size and distribution.

In view of the above, the inventor considered removing the above amorphous layer before acid texturing the polycrystalline silicon wafer cut out with a bonded abrasive wire. In PTL 1 referred to above, although the wafer is not cut using a bonded abrasive wire, the acid texturing is performed after removing the irregularities caused due to slicing by etching to the depth of 7 μm or more with alkaline solution. Accordingly, this method was applied to a polycrystalline silicon wafer cut out using a bonded abrasive wire. However, the surface having been subjected to acid texturing had a non-uniform uneven structure, and the conversion efficiency of the obtained solar cell was found to be not significantly improved.

Figure 3A:
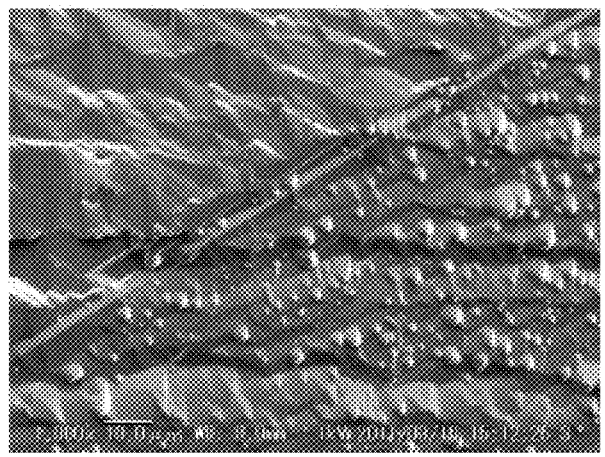
FIGS. 3(a) and 3(b) are SEM images illustrating a surface of a polycrystalline silicon wafer according to Comparative Example 9, in which 3(a) shows the surface of the wafer obtained by cutting polycrystalline silicon using a bonded abrasive wire, which wafer is subsequently etched with an alkaline solution, and 3(b) shows the wafer surface subjected to subsequent acid texturing.
Figure 3B:
Figure 3B:
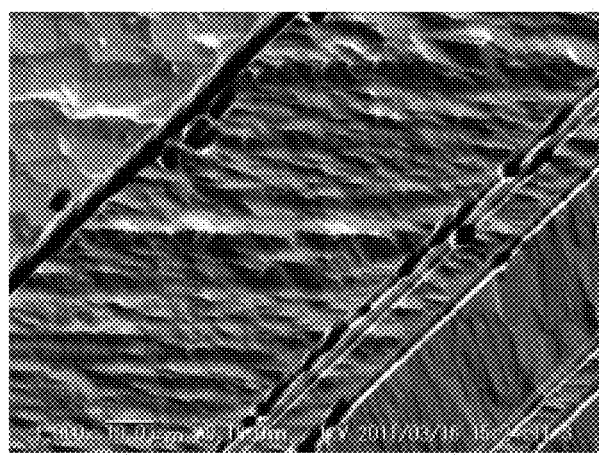

The surface conditions here were as follows. First, the surface from which the irregularities caused due to the slicing were removed with an alkaline solution had a shape such that the crystal surfaces of the polycrystalline silicon were exposed as shown in FIG. 3(a). Specifically, there were surfaces of a variety of crystal orientations under the irregularities in the polycrystalline silicon wafer caused due to slicing using a bonded abrasive wire. When the wafer was etched to an extent such that the irregularities were removed together with the amorphous layer, crystalline portions of the surface were also etched, which resulted in a non-uniform surface profile in which various crystal surfaces are exposed in the wafer surface. For example, portions having a crystal orientation of (100) surface form a pyramidal textured structure, whereas portions of (110) surface form deep grooves having (111) side surfaces; thus, the uneven structure is not uniform in the wafer surface. When such a wafer for solar cell was acid textured, it was found that the profile of the wafer surface was such that the non-uniform uneven structure was left after the alkali treatment as shown in FIG. 3(b). When electrodes are formed on the surface, the conditions of the irregularities in the surface vary between the crystal grains, which results in varied electric resistance. Thus, the inventor concluded that the solar cells produced from this wafer cannot achieve high conversion efficiency.

Based on the above findings, the inventor conceived of the following. Before acid texturing, instead of removing the irregularities caused due to slicing using a bonded abrasive wire to expose the crystal surfaces, the irregularities caused due to slicing using the bonded abrasive wire can be rather deliberately left by removing only the amorphous layer formed on the surface. Thus, a uniform textured structure can be formed in the wafer surface by acid texturing.

Figure 1B:
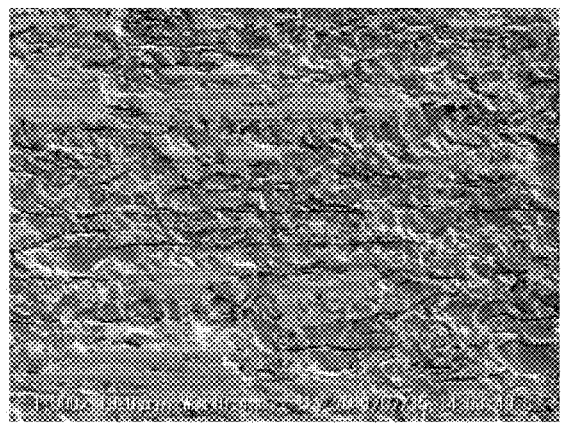

The wafer for solar cell according to the present invention has at least one surface free of an amorphous layer, and irregularities caused due to slicing with a bonded abrasive wire are left on the at least one surface. FIGS. 1(a) to 1(c) and FIGS. 2(a) and 2(b) are SEM images each illustrating a surface of a polycrystalline silicon wafer. FIG. 1(a) shows a surface of a wafer immediately after being obtained by cutting polycrystalline silicon using a bonded abrasive wire. FIG. 1(b) and FIG. 2(a) each show a surface of a wafer for solar cell according to the present invention, in which irregularities caused due to slicing using the bonded abrasive wire are left by removing only the amorphous layer.

Figure 1C:
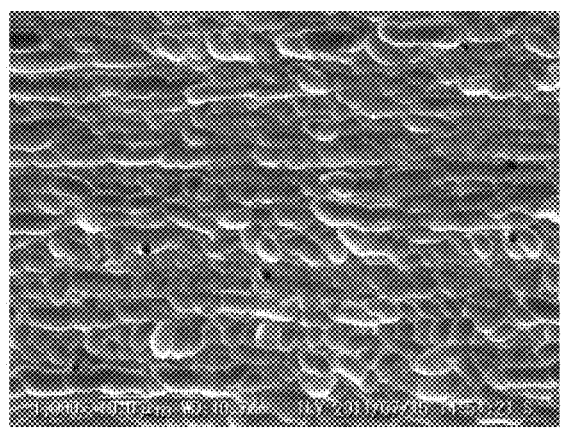
Figure 2A:
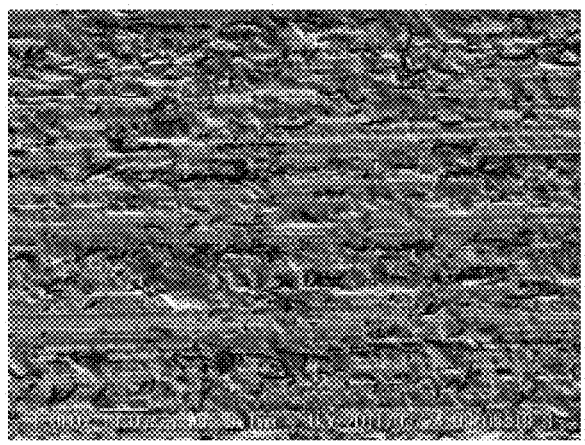
FIGS. 2(a) and 2(b) are SEM images illustrating a surface of a polycrystalline silicon wafer according to Example 12, in which 2(a) shows the surface of the wafer obtained by cutting polycrystalline silicon using a bonded abrasive wire, which wafer has been etched with an alkaline solution containing 2.0% KS-3050 and 0.1% KOH, and 2(b) shows the wafer surface subjected to subsequent acid texturing.
Figure 2B:

FIG. 1(c) and FIG. 2(b) each show a surface of a wafer for solar cell according to the present invention, immediately after being subjected to acid texturing, in which a uniform uneven structure is found to be formed throughout the wafer surface as compared with FIG. 3(b) and FIG. 4. Thus, acid texturing on the wafer for solar cell according to the present invention can form irregularities uniform in size and distribution all over the surface, and thus solar cells with high conversion efficiency can be produced.

Here, whether there is an amorphous layer or not is determined in the present invention as follows. When a shoulder peak is observed in a Raman spectral range of 420 cm$^{-1}$ to 480 cm$^{-1}$ measured by Raman spectroscopy, an amorphous layer is determined to exist. On the other hand, if no shoulder peak is observed in the range of 420 cm$^{-1}$ to 480 cm$^{-1}$, an amorphous layer is determined not to exist in the wafer surface.

(Method of Producing Wafer for Solar Cell)

Examples of a method of producing a wafer for solar cell according to the present invention includes a method characterized by bringing an alkaline solution containing alkali containing N (nitrogen) as a constituent element into contact with at least one surface of a polycrystalline semiconductor wafer cut out with a bonded abrasive wire to perform etching to the state where the at least one surface has no amorphous layer and has irregularities caused due to the slicing using the bonded abrasive wire being left.

Further, adding an acid texturing step to the above process, a wafer for solar cell provided with a uniform uneven structure capable of suppressing the reflection loss can be formed.

Unlike the technique of removing cutting damage by subjecting a polycrystalline silicon wafer to alkali treatment to obtain a wafer for solar cell, and forming an uneven structure in the wafer for solar cell by acid texturing, the present invention is based on the following technical idea which is significantly different from the conventional method. A wafer for solar cell from which an amorphous layer is selectively removed by etching with a certain alkaline solution is subjected to acid texturing, thus forming an optimal uneven structure in the entire wafer surface by combining the certain alkali treatment and acid texturing. This makes it possible to manufacture solar cells with high conversion efficiency using a polycrystalline semiconductor wafer cut out using the bonded abrasive wire.

According to the studies made by the inventor, it was found that although the irregularities formed by etching with an acid solution in such a wafer cut out using a bonded abrasive wire were likely to be non-uniform in size and distribution, the irregularities can be made uniform in size and distribution by selectively etching the amorphous layer in the wafer surface with an alkaline solution containing alkali containing N as a constituent element and by subsequently performing etching with an acid solution.

The amorphous layer is preferentially removed with the alkaline solution containing alkali containing N as a constituent element. The amorphous layer can also be removed with a given alkaline solution or acid solution. However, when acid etching is performed with the irregularities caused due to the slicing using the bonded abrasive wire being left as much as possible, a wafer for solar cell having a desired texture can be obtained. Accordingly, in order to remove the amorphous layer which inhibits acid texturing while leaving the irregularities caused due to the slicing using the bonded abrasive wire as much as possible, the treatment using the alkaline solution containing alkali containing N as a constituent element is required.

Examples of alkalis containing N include ammonia, hydrazine, tetraalkylammonium hydroxide and amine. In the tetraalkylammonium hydroxide, each alkyl moiety preferably contains 1 to 3 carbon atoms, and tetramethylammonium hydroxide (TMAH) is preferably used in particular. The amine may be any one of primary amine, secondary amine, and tertiary amine, in which each hydrocarbon group preferably contains 1 to 3 carbon atoms. The amine may be an alkanolamine in which at least one hydrogen atom in each hydrocarbon group was substituted with an OH group. As the amine, for example methylamine, dimethylamine, or trimethylamine can be used.

Further, in the present invention, etching is performed to an extent such that the amorphous layer is not left and irregularities caused due to slicing using a bonded abrasive wire are left; accordingly, it is preferable to use an alkaline solution containing hydrogen peroxide thereby reducing the etching rate, in terms of controlling the etch depth. The alkaline solution may contain hydrogen peroxide of, for example, 0.1 mass % to 6.0 mass %, preferably 0.1 mass % to 3.0 mass %, and more preferably 1.5 mass % to 3.0 mass %.

In order to reduce the etch rate, a surfactant may be contained in the alkaline solution. The surfactant is not limited in particular as long as the component does not extremely reduce the reactivity of etching with the alkali containing N; however, the surfactant is preferably an anionic surfactant or a nonionic surfactant, and preferably includes a polymer having a molar weight of 1000 or less. Moreover, a surfactant containing aminoethanol is particularly preferable.

As the alkaline solution containing a surfactant, for example, CLEANTHROUGH™ KS-3050 produced by Kao Corporation (hereinafter referred to as "KS-3050") can be used. KS-3050 contains a surfactant containing aminoethanol, and is a solution containing 2-aminoethanol as an alkanolamine. When KS-3050 is used alone for the alkaline solution, etching depends on the concentration of KS-3050 and the treatment time. The concentration is preferably in the range of, for example, 0.1 mass % to 10 mass %, more preferably in the range of 1 mass % to 5 mass %, and still more preferably in the range of 2 mass % to 3 mass %. A concentration less than 0.1 mass % cannot ensure sufficient etching, or would take too long, whereas a concentration exceeding 10 mass % increases cost and would make it impossible to completely remove the surfactant by rinsing in a subsequent step. In order to increase the reaction rate of KS-3050, KOH may be added at 1 mass % or less. The amount added is preferably 1 mass % or less, since a higher amount would eliminate the effect of preferentially etching the amorphous layer.

The time for treatment with an alkaline solution, that is, the time for which the wafer surface is in contact with the alkaline solution is not limited in particular as long as the irregularities caused due to slicing with a bonded abrasive are left without an amorphous layer. For example, the treatment time is preferably about 3 min to 30 min, more preferably 5 min to 20 min, and most preferably 5 min to 10 min.

Further, the concentration of alkali containing N in the alkaline solution used for etching is not limited in particular as long as the etching can be performed such that the irregularities caused due to slicing using a bonded abrasive wire are left without an amorphous layer. For example, the concentration is preferably in the range of, for example, 0.1 mass % to 3.0 mass %, more preferably in the range of 1.0 mass % to 2.5 mass %, and most preferably in the range of 1.5 mass % to 2.0 mass %.

In addition, the treatment temperature of etching with an alkaline solution is not limited in particular as long as the etching can be performed such that the irregularities caused due to slicing using a bonded abrasive wire are left without an amorphous layer. For example, the treatment temperature can be, for example, 30° C. to 50° C., preferably 35° C. to 45° C.

For the acid solution used for acid texturing, an aqueous solution containing hydrofluoric acid and nitric acid is preferably used. The acid solution may preferably be one in which, for example, hydrofluoric acid at a concentration of 50 mass % and nitric acid at a concentration of 70 mass % and water are mixed. The final concentrations of hydrofluoric acid and nitric acid are preferably 1 mass % to 10 mass % and 10 mass % to 50 mass %, respectively, more preferably, 3 mass % to 6 mass % and 20 mass % to 40 mass %, respectively.

Examples of a method of bringing a treatment solution into contact with the wafer surface include dip coating and spray coating. Alternatively, a casting method of dropping the treatment solution onto one side of the wafer, acting as the light receiving surface may be used.

The method of producing a wafer for solar cell according to the present invention has been described as above with its operation and effects. An additional advantage of this producing method is in that the flaws caused by slicing are not necessarily removed completely. Specifically, the machining allowance from the wafer is significantly smaller than in conventional techniques, which results in reduced material loss; thus an inexpensive solar cell can be provided.

(Method of Producing Solar Cell)

A method of producing a solar cell, according to the present invention further includes, in addition to the steps of the method of producing a wafer for solar cell according to the present invention described heretofore, a process of producing a solar cell using the wafer for solar cell. The process of producing the cell includes, at least, a step of forming a pn junction by dopant diffusion heat treatment and a step of forming electrodes. In the dopant diffusion heat treatment, phosphorus is thermally diffused into a p-type substrate.

Note that the step of forming the pn junction may be carried out before the etching process according to the present invention. In other words, after slicing, the etching process according to the present invention is performed on the wafer in a state where the pn junction has been formed by the dopant diffusion heat treatment. A solar cell can be produced by forming the electrodes on the wafer for solar cell thus obtained.

According to the method of producing a solar cell according to the present invention, a solar cell with reduced reflection loss of the incident light on the light receiving surface of the cell and with high energy conversion efficiency can be obtained.

(Method of Producing Solar Cell Module)

A method of producing a solar cell module according to the present invention further includes, in addition to the steps of the method of producing the solar cell described above, a process of producing a solar cell module using the solar cell. The process of producing a module includes a step of arranging a plurality of solar cells and wiring electrodes, a step of arranging the wired solar cells on a tempered glass substrate and sealing them with resin and a protective film, and a step of assembling an aluminum frame and electrically connecting a terminal cable to the wiring.

The method of producing a solar cell module according to the present invention can suppress the reflection loss of the incident light on the light receiving surface of the solar cell, and thus obtaining a solar cell module with high energy conversion efficiency.

Thus, the present invention has been described to show examples of typical embodiments. However, the present invention is not limited to these embodiments, and can be changed in various manners within the scope of the present invention.

EXAMPLES

In order to further clarify the effects of the present invention, comparative evaluations for Examples and Comparative Examples described below will be discussed.

Preparation of Sample

Examples

First, 156 mm square p-type polycrystalline silicon wafers (thickness: 0.2 mm) were prepared by slicing using a bonded abrasive wire. The wafers were immersed in alkaline solutions in Table 1 under the temperature and time conditions shown in Table 1. The wafers were then cleaned with water, and dried in a nitrogen atmosphere, thus producing wafers for solar cell of the present invention. After that, etching was performed using an acid solution prepared by mixing 50 mass % hydrofluoric acid, 70 mass % nitric acid, and water at 1:4:5 (volume ratio) at room temperature for 3 minutes, and the wafers were then dried.

Comparative Example 1

First, 156 mm square p-type polycrystalline silicon wafers (thickness: 0.2 mm) were prepared by slicing using a bonded abrasive wire. Without performing etching with alkaline solution, etching was performed using an acid solution prepared by mixing 50 mass % hydrofluoric acid, 70 mass % nitric acid, and water at 1:4:5 (volume ratio) at room temperature for 3 minutes, and the wafers were then dried. Thus, wafers for solar cell according to Comparative Example 1 were produced.

Comparative Example 2

First, 156 mm square p-type polycrystalline silicon wafers (thickness: 0.2 mm) were prepared by slicing using a free abrasive wire. Without performing etching with alkaline solution, etching was performed using an acid solution prepared by mixing 50 mass % hydrofluoric acid, 70 mass % nitric acid, and water at 1:4:5 (volume ratio) at room temperature for 3 minutes, and the wafers were then dried. Thus, wafers for solar cell according to Comparative Example 2 were produced.

Comparative Examples 3 to 9

Wafers for solar cell according to Comparative Examples 3 to 9 were produced in the same manner as Examples except that the solutions shown in Table 1 were used as alkaline solutions, and the time of the treatment with the alkaline solutions was as shown in Table 1.

<Evaluation 1: Evaluation on Amorphous Layer Residue>

Figure 5:
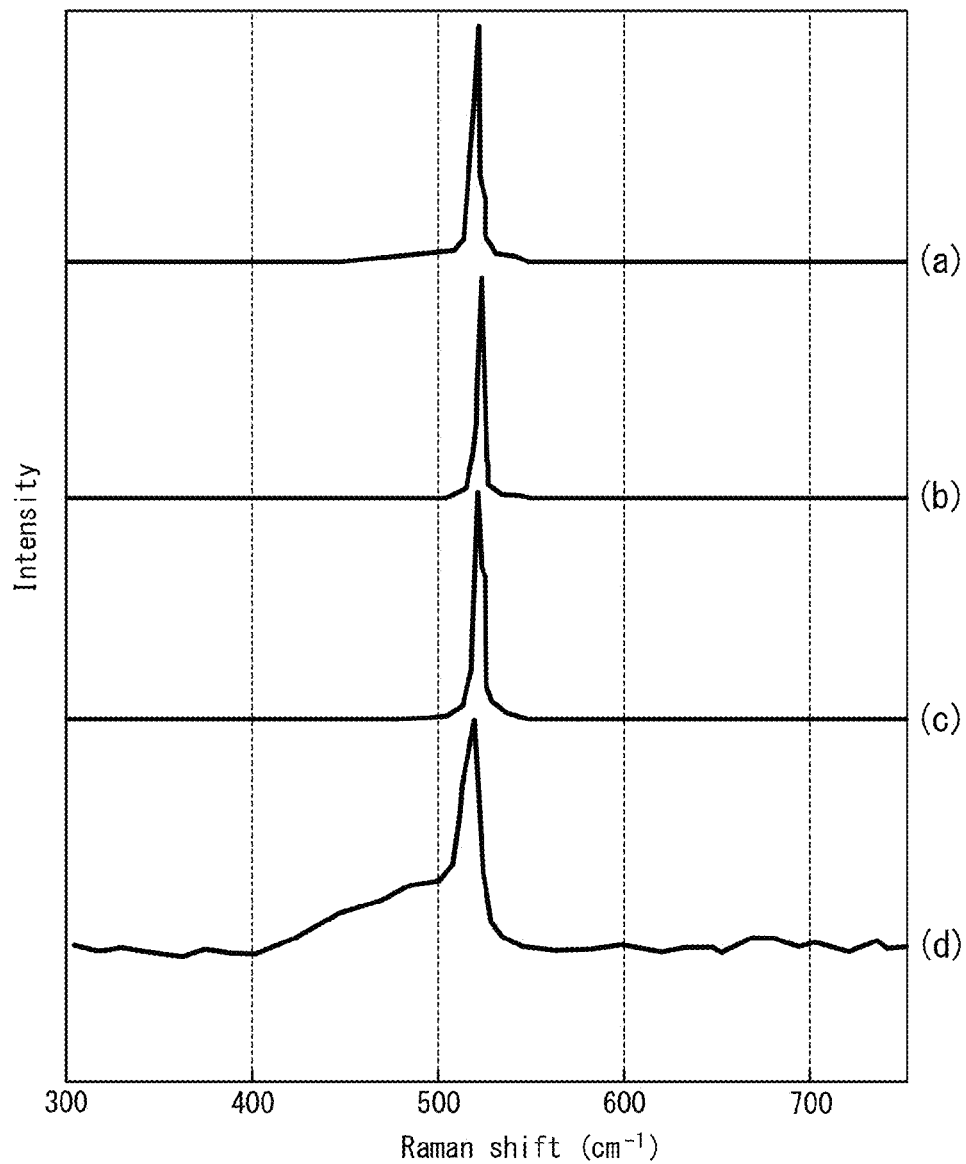
FIG. 5 shows the results of Raman spectrometry on a surface of polycrystalline silicon wafers which have not been subjected to acid texturing. (a), (b), and (c) correspond to surfaces of the wafers obtained by cutting polycrystalline silicon using a bonded abrasive wire and subjected to etching with alkaline solution in Example 7, Example 8, and Example 12, respectively, and (d) corresponds to a surface of the wafer obtained by cutting polycrystalline silicon using a bonded abrasive wire in Comparative Example 1.

Raman spectrometry was performed on the surface of each of the polycrystalline silicon wafers before acid texturing, obtained in Examples and Comparative Examples using a laser Raman spectrometer (LabRAM HR-80 manufactured by JOBIN YVON S.A.S.). FIG. 5 shows part of the measurement results. (a), (b), and (c) correspond to surfaces of the wafers obtained by cutting polycrystalline silicon using a bonded abrasive wire and subjected to etching with alkaline solution in Example 7, Example 8, and Example 12, respectively, and (d) corresponds to a surface of the wafer obtained by cutting polycrystalline silicon using a bonded abrasive wire in Comparative Example 1. As described above, the shoulder peak in the range of 420 $cm^{-1}$ to 480 $cm^{-1}$ indicates that an amorphous layer is left. A shoulder peak in that range appears in FIG. 5(d) but not in FIG. 5(a) to (c). This shows that there was an amorphous layer on the wafer cut out using the bonded abrasive wire (Comparative Example 1), whereas there was no amorphous layer on the wafers for solar cell according to the present invention, obtained by treatment with an alkaline solution.

As clear from the comparison between FIGS. 5(a) to 5(c) and FIG. 5(d), the behavior of the spectra in the range of 420 $cm^{-1}$ to 480 $cm^{-1}$ was significantly different depending on the existence of the amorphous layer. Further, the same spectral behavior was observed in other examples as in FIGS. 5(a) to 5(c), and thus nonexistence of the amorphous layer was confirmed. Also in Comparative Examples 4, 6, 7, and 9, since etching using alkaline solution was performed such that the irregularities caused due to slicing are removed, naturally no amorphous layer was found. On the other hand, in Comparative Examples 3, 5, and 8, the same spectral behavior as FIG. 5(d) appeared; thus, it was found that the treatment with alkaline solution was insufficient for completely removing the amorphous layer. Note that since slicing was performed using free abrasive grains in Comparative Example 2, no amorphous layer existed from the beginning.

<Evaluation 2: Observation and Analysis of Uneven Structure>

The surfaces of the wafers of Examples and Comparative Examples were observed with a scanning electron microscope (SEM). Typical examples are shown below.

FIG. 4 is a SEM image illustrating a surface of a polycrystalline silicon wafer according to Comparative Example 1 after acid texturing. In the surface of the wafer immediately after being cut out from the polycrystalline silicon wafer using a bonded abrasive wire, irregularities caused due to the cutting are formed to have an orientation like a striped pattern along the reciprocating direction of the wire (the left/right direction in the drawing of FIG. 4). FIG. 4 shows that the transverse stripes are left after etching with an acid solution. In particular, the irregularities forming the stripes are relatively large in size and the smaller irregularities are formed between adjacent stripes; thus, the irregularities non-uniform in size and distribution are formed in the wafer surface.

FIGS. 1(a) to 1(c) are SEM images illustrating a surface of a polycrystalline silicon wafer according to Example 8, in which (a) shows the surface of the wafer after being cut out from polycrystalline silicon using a bonded abrasive wire, (b) shows the wafer surface subjected to subsequent etching with an alkaline solution, and (c) shows the wafer surface further subjected to later etching with an acid solution. FIGS. 2(a) and 2(b) are SEM images illustrating a surface of a polycrystalline silicon wafer according to Example 12, in which (a) shows the surface of the wafer obtained by cutting polycrystalline silicon using a bonded abrasive wire, which wafer has been etched with an alkaline solution, and (b) shows the wafer surface subjected to subsequent etching with an acid solution. FIG. 1(b) and FIG. 2(a) show that the irregularities caused due to slicing with the bonded abrasive wire are left on the wafer surface, although they are rather more unclear than immediately after the slicing. Further, FIG. 1(c) and FIG. 2(b) show that etching with an acid solution formed irregularities more uniform in size and distribution than in FIG. 4 in the wafer surface. Note that irregularities caused due to the slicing with the bonded abrasive wire were also left on the wafer surfaces after alkali treatment before acid texturing in other examples.

FIGS. 3(a) and 3(b) are SEM images illustrating a surface of a polycrystalline silicon wafer according to Comparative Example 9, in which (a) shows the surface of the wafer obtained by cutting polycrystalline silicon using a bonded abrasive wire, which wafer is subsequently etched with an alkaline solution, and (b) shows the wafer surface subjected to subsequent acid texturing. As clear from FIG. 3(a), the irregularities caused due to slicing were apparently removed in a stage after alkali treatment and before acid texturing, and various crystal surfaces were exposed in the wafer surface. Comparing FIG. 1(b) and FIG. 2(a) with FIG. 3(a), it is clear that whether the irregularities caused due to slicing were left or not can be clearly determined from the SEM images. Also in Comparative Examples 4, 6, and 7, the irregularities caused due to the slicing were apparently removed as in Comparative Example 9. Note that in Comparative Examples 3, 5, and 8, the alkali treatment was not sufficient for completely removing the amorphous layer, so that the irregularities caused due to the slicing were left. In Comparative Example 2, since the slicing was performed by free abrasive cutting, irregularities relatively uniform in size and distribution were formed in the surface after the acid texturing.

Based on the above, whether an amorphous layer was left on the surface before acid texturing and whether irregularities caused due to the slicing using the bonded abrasive wire were left on the surface or not in Examples and Comparative Examples are summarized in Table 1.

<Evaluation 3: Measurement of Conversion Efficiency>

P-OCD (manufactured by TOKYO OHKA KOGYO CO., LTD., type: P-110211) was applied, by spin coating, to the wafer of each of Examples and Comparative Examples. Then, the wafer was subjected to a diffusion heat treatment to form the pn junction, and phosphorus glass on the surface was removed with hydrogen fluoride. After that, an ITO film was formed as an anti-reflection film on a phosphorus diffusion surface of the wafer surface by sputtering. Further, the electrodes were formed in front and on the rear surfaces of the wafer by applying Ag paste for an Ag electrode to the front surface and Al paste for an Al electrode to the rear surface and were subjected to heat treatment, thus the solar cell was produced. Table 1 shows the results of measurement of energy conversion efficiency measured by an energy conversion efficiency measuring instrument (YQ-250BX produced by IZUMI TECH).

Figure 2B:
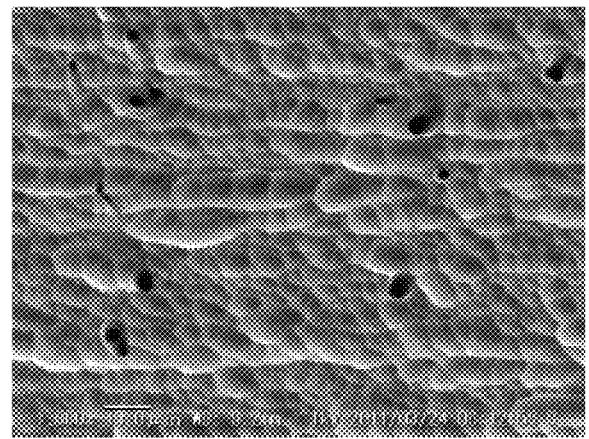

Higher conversion efficiency was obtained in Examples than in Comparative Examples other than Comparative Example 2; thus, the conversion efficiency of the solar cell in Examples approached that of the solar cell in Comparative Example 2 produced from a wafer cut out with a free abrasive wire. This is attributed to that as shown in FIG. 1 (a) to 1 (c) and FIGS. 2 (a) and 2 (b), an uneven structure non-uniform in size and distribution is formed in the wafer surface. On the other hand, when an amorphous layer exists (Comparative Examples 1, 3, 5, and 8) or alternatively when the irregularities formed due to the slicing are also removed even when the amorphous layer can be removed (Comparative Examples 4, 6, 7, and 9), high conversion efficiency was not obtained.

TABLE 1

| | Alkali treatment conditions | | | Wafer surface before acid treatment | | |
|---|---|---|---|---|---|---|
| | Alkaline solution | Temp. (° C.) | Time (min) | Amorphous layer on wafer surface | Irregularities due to slicing | Conversion efficiency |
| Example 1 | 0.1% NH$_4$H | 30 | 10 | None | Left | 15.82 |
| Example 2 | 1.5% NH$_4$OH | 30 | 10 | None | Left | 16.15 |
| Example 3 | 3.0% NH$_4$OH | 30 | 10 | None | Left | 15.79 |
| Example 4 | 1.5% NH$_4$OH | 40 | 10 | None | Left | 16.05 |
| Example 5 | 1.5% hydrazine | 30 | 10 | None | Left | 16.06 |
| Example 6 | 1.5% dimethylamine | 30 | 10 | None | Left | 16.02 |
| Example 7 | 1.5% NH$_4$OH/0.1% H$_2$O$_2$ | 50 | 10 | None | Left | 15.82 |
| Example 8 | 1.5% NH$_4$OH/1.5% H$_2$O$_2$ | 50 | 10 | None | Left | 16.14 |
| Example 9 | 1.5% NH$_4$OH/3.0% H$_2$O$_2$ | 50 | 10 | None | Left | 15.80 |
| Example 10 | 2.0% KS-3050 | 50 | 10 | None | Left | 16.21 |
| Example 11 | 2.0% KS-3050/0.1% KOH | 50 | 5 | None | Left | 16.31 |
| Example 12 | 2.0% KS-3050/0.1% KOH | 50 | 10 | None | Left | 16.23 |
| Example 13 | 2.0% KS-3050/1.0% KOH | 50 | 10 | None | Left | 16.05 |

TABLE 1-continued

| | Alkali treatment conditions | | | Wafer surface before acid treatment | | Conversion efficiency |
|---|---|---|---|---|---|---|
| | Alkaline solution | Temp. (° C.) | Time (min) | Amorphous layer on wafer surface | Irregularities due to slicing | |
| Comparative Example 1 | — | — | — | Left | Left | 15.43 |
| Comparative Example 2 | — | — | — | — | — | 16.20 |
| Comparative Example 3 | 0.05% NH$_4$OH | 30 | 10 | Left | Left | 15.40 |
| Comparative Example 4 | 3.5% NH$_4$OH | 30 | 10 | None | None | 15.36 |
| Comparative Example 5 | 1.5% NH$_4$OH | 20 | 10 | Left | Left | 15.43 |
| Comparative Example 6 | 1.5% NH$_4$OH | 60 | 10 | None | None | 15.36 |
| Comparative Example 7 | 1.5% NH$_4$OH/0.05% H$_2$O$_2$ | 50 | 10 | None | None | 15.42 |
| Comparative Example 8 | 1.5% NH$_4$OH/6.0% H$_2$O$_2$ | 50 | 10 | Left | Left | 15.41 |
| Comparative Example 9 | 1.5% KOH | 50 | 10 | None | None | 15.09 |

INDUSTRIAL APPLICABILITY

The present invention can provide a wafer for solar cell which can be produced using a polycrystalline semiconductor wafer cut out using a bonded abrasive wire, which wafer can be used for manufacturing a solar cell with high conversion efficiency.

The invention claimed is:

1. A method of producing a wafer for solar cell, comprising:
   cutting a polycrystalline semiconductor ingot using a bonded abrasive wire to obtain a polycrystalline semiconductor wafer, wherein irregularities and an amorphous layer due to the cutting are formed on at least one surface, and further wherein the irregularities have an orientation like a striped pattern;
   a first etching after cutting of the at least one surface of the polycrystalline semiconductor wafer includes removing the amorphous layer from the at least one surface and leaving the irregularities in the at least one surface, and further, wherein the first etching includes bringing an alkaline solution containing alkali containing N as a constituent element into contact with the at least one surface; and
   a second etching after cutting includes texturing with an acidic solution the at least one surface with the irregularities and without the amorphous layer of the polycrystalline semiconductor wafer.

2. The method of producing a wafer for solar cell, according to claim 1, wherein the alkaline solution contains hydrogen peroxide.

3. The method of producing a wafer for solar cell, according to claim 1, wherein the alkaline solution contains a surfactant.

4. A method of producing a solar cell further comprising, in addition to the steps of the method of producing a wafer for solar cell according to claim 1, a step of producing a solar cell from the wafer for solar cell.

5. A method of producing a solar cell module further comprising, in addition to the steps of the method of producing the solar cell according to claim 4, a step of producing a solar cell module from the solar cell.

6. The method of producing a wafer for solar cell according to claim 1, wherein the alkali contained in the alkaline solution is selected from the group consisting of ammonia, hydrazine, ammonium, and amine.

* * * * *